(12) United States Patent
Roizin

(10) Patent No.: US 6,788,576 B2
(45) Date of Patent: Sep. 7, 2004

(54) COMPLEMENTARY NON-VOLATILE MEMORY CELL

(75) Inventor: Yakov Roizin, Migdal Haemek (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 5 days.

(21) Appl. No.: 10/282,856

(22) Filed: Oct. 28, 2002

(65) Prior Publication Data

US 2004/0080982 A1 Apr. 29, 2004

(51) Int. Cl.[7] .............................................. G11C 16/00
(52) U.S. Cl. .............................. 365/185.1; 365/185.17; 365/158.28; 365/185.29
(58) Field of Search ........................ 365/158.1, 185.17, 365/185.18, 185.28, 185.29

(56) References Cited

U.S. PATENT DOCUMENTS

| | | | | |
|---|---|---|---|---|
| 5,357,466 A | * | 10/1994 | Hong | 365/185.3 |
| 5,847,993 A | * | 12/1998 | Dejenfelt | 365/185.1 |
| 6,317,349 B1 | * | 11/2001 | Wong | 365/49 |

OTHER PUBLICATIONS

Publication entitled: "High–Performance EEPROM's Using N– and P–Channel Polysilicon Thin–Film Transistors With Electron Cyclotron Resonance N2O–Plasma Oxide", Lee et al.; IEEE Electron Device Letters; vol. 20; No. 1; Jan. 1999; pp. 15–17.

Publication entitled: "Device Characteristics Of 0.35 um P–Channel DINOR Flash Memory Using Band–To–Band Tunneling Induced Hot Electron (BBHE) Programming"; Ohnakado et al.; IEEE Transactions on Electron Devices; vol. 46; No. 9; Sep. 1999; pp. 1866–1870.

* cited by examiner

Primary Examiner—Tan T. Nguyen
(74) Attorney, Agent, or Firm—Bever, Hoffman & Harms, LLP; Patrick T. Bever

(57) ABSTRACT

A complimentary non-volatile memory (CNVM) cell includes an n-channel transistor and a p-channel transistor that have drains connected like a CMOS inverter, and that are controlled by a shared floating gate and a shared control gate. The CNVM cell is programmed by band-to-band tunneling (BBT) electrons generated in the source of p-channel transistor, and is erased by BBT holes generated in the source of n-channel transistor (or by back tunneling of electrons from the floating gate). Read out is performed using a select transistor connected to the drains of the n-channel and p-channel transistors.

12 Claims, 3 Drawing Sheets

COMPLEMENTARY NON-VOLATILE MEMORY CELL

FIELD OF THE INVENTION

This invention relates to integrated circuits, and in particular to complementary metal-oxide-silicon (CMOS) integrated circuits that include non-volatile memory (NVM) devices, such as arrays of flash memory or electrically erasable programmable read only memory cells.

BACKGROUND OF THE INVENTION

Electrically erasable and programmable read only memories (EEPROMs) and flash erasable and programmable read only memories (flash EPROMs) are two types of non-volatile memory (NVM) devices that can be embedded into an integrated circuit (IC) to provide non-volatile data storage for the IC circuitry. ICs including embedded NVM devices have an advantage over other ICs in that certain data (e.g., configuration settings or security information) can be retained in the IC even if power is disconnected.

Embedded EEPROM and flash EPROM cells (hereafter collectively referred to as an EEPROM cell for brevity) typically comprise a sort of modified field-effect transistor (FET) that includes an electrically isolated floating gate (e.g., polycrystalline silicon or oxide-nitride-oxide (ONO)) for controlling conduction between source and drain regions of the EEPROM cell. A gate dielectric (bottom oxide) is formed between the floating gate and an underlying channel region between the source and drain regions. A control gate is provided adjacent to (e.g., above) the floating gate, and is separated from the floating gate by an inter-gate dielectric (top oxide).

The data value stored by an EEPROM cell is determined by the amount of charge stored in the floating gate, which is controlled during program and erase operations by applying predetermined voltages across the floating gate. For example, during a program (write) operation, a net negative charge is transferred to and stored by the floating gate using a technique such as hot electron injection or Fowler-Nordheim (FN) tunneling. In this programmed state, the negative charge stored by the floating gate prevents current flow between the source and drain regions of the memory cell when the control gate is asserted (i.e., pulled high). Conversely, an erase operation transfers a net negative charge from the floating gate using, for example, FN tunneling. In the erased state, the neutral charge stored by the floating gate permits current flow between the source and drain regions of the memory cell when the control gate is asserted.

One of the limitations associated with incorporating "embedded" EEPROM cells into ICs fabricated using conventional complementary metal-oxide-silicon (CMOS) techniques is that EEPROM cells typically require special processing steps that are not part of "standard" CMOS fabrication processes. For example, EEPROM cells employing FN tunneling typically require additional "deep" n-type well (deep n-well) structures to generate high fields in the bottom oxide of the EEPROM cells, which are necessary to facilitate the FN tunneling process but are typically not part of "standard" CMOS processes. Further, the high fields are generated by applying a positive voltage to the deep n-well, and applying a negative voltage to the control gate of the EEPROM cell, thereby producing a relatively high voltage potential across the oxides surrounding the floating gate (i.e., compared to that of "normal" FETs produced on the IC device). This high voltage potential produces a need for special high voltage oxides for the EEPROM cells, which are also typically not part of "standard" CMOS processes. As a result, a "standard" CMOS process must be modified to include additional masks and process steps to facilitate the formation of the EEPROM cells, which increases the manufacturing costs of the ICs produced by the modified CMOS process.

Another limitation associated with incorporating "embedded" EEPROM cells into ICs is the large amount of chip area required for controlling EEPROM operations. As mentioned above, EEPROMs require relatively high voltages to perform program and erase operations using FN or hot electron injection techniques. In the case of Channel Hot Electron (CHE) programming, large currents flow in the EEPROM channels. To generate these high voltages and to maintain these high currents, charge pumps are typically provided adjacent the EEPROM cells that convert relatively low system voltages into the high voltages needed during program and erase according to known techniques. In addition to the chip area required for these charge pumps, conventional embedded EEPROM cells typically require additional control circuitry for monitoring the amount of charge stored on the floating gate during erase operations in order to prevent an over-erase condition. That is, if too large of a net positive charge is stored on the floating gate due to over-erasure, then the EEPROM cell remains turned on even when the control gate is de-asserted. The control circuitry performs an algorithm in conjunction with sensing circuitry that applies the erasing voltage for a short period, measures the charge stored on the floating gate after each period, and terminates the erasing operation when the desired neutral charge is achieved. The total chip area required for is control circuitry and the charge pump, along with other circuitry needed to operate the EEPROM cells, significantly increases the overall IC device size, thereby making IC devices with embedded EEPROM cells relatively expensive.

What is needed is a low cost NVM embedded memory cell that is easily integrated into standard CMOS process. In particular, what is needed is an NVM embedded memory cell that exhibits low power consumption (low voltages and currents) in all operating regimes (program, erase, read), is operated using simple program/erase algorithms, and requires a small area periphery (i.e., for sensing stored data values, and charge pumps needed to generate program/erase voltages).

SUMMARY OF THE INVENTION

The present invention is directed to a complementary non-volatile memory (CNVM) cell including a p-channel transistor and an n-channel transistor that share both a floating gate structure and a control gate structure (i.e., a floating gate structure extends over channel regions of both the p-channel and n-channel transistors). In addition, the drain terminal of the n-channel transistor is connected to the drain terminal of the p-channel transistor, and the CNVM cell also includes a select transistor connecting the drains of the p-channel and n-channel transistors to a read bit line.

According to an aspect of the present invention, by using shared floating gate structure and a shared control gate to control the operation of the p-channel and n-channel transistors, the CNVM cell facilitates band-to-band tunneling (BBT) during both program and erase operations. BBT facilitates both low current and relatively low program/erase operations that can be facilitated using standard CMOS fabrication processes. In one embodiment, the CVNM cell is programmed by applying a relatively low negative voltage (e.g., −6 V) to the source of the p-channel transistor, and a relatively low positive voltage (e.g., +6 V) to the control gate structure (the source of the n-channel transistor is open (floating), and the n-well in which the p-channel transistor is formed is grounded). Under these conditions, BBT electrons generated in the source of the p-channel transistor are injected into the floating gate structure through the intervening gate oxide, thereby increasing the net negative charge stored in the floating gate. Conversely, the CNVM cell is erased by applying a relatively low positive voltage (e.g., +6 V) to the source of the n-channel transistor and a relatively low negative voltage (e.g., −6 V) to the control gate structure (both the source of the n-channel transistor and the n-well in which the p-channel transistor is formed are open (floating)). Under these conditions, BBT holes generated in the source of the n-channel transistor flow into the floating gate structure (or back tunneling electrons pass from the floating gate into the source of the n-channel transistor), thereby decreasing the net negative charge stored in the floating gate. Accordingly, in contrast to conventional NVM cells, the CNVM cell of the present invention better facilitates embedded memory in a CMOS device because the CNVM cell can be fabricated using the same "standard" CMOS process used to fabricate the "normal" FETs of the CMOS device (i.e., the additional mask and oxide deposition steps needed to form the thick gate oxides needed in conventional embedded NVM cells are avoided).

According to another aspect of the present invention, the CNVM facilitates a low voltage and low current read operation that is similar to the operation of a CMOS inverter. In one embodiment, during a read operation, the source region of the p-channel transistor is maintained at a positive voltage (e.g., 1.8 Volts), and the source region of the n-channel transistor is grounded. The CNVM cell is read by transmitting a positive voltage (e.g., 1.8 Volts) to the control gate and turning on the select transistor (e.g., transmitting 5 Volts on select line SEL). Under these conditions, when the floating gate is programmed (i.e., stores a net negative charge), the p-channel transistor is turned on despite the high word line signal, thereby passing a high output signal to the read bit line through the p-channel transistor and the select transistor. Conversely, when the floating gate is erased, the n-channel transistor is turned on when the word line signal is pulled high, thereby pulling down the read bit line via the n-channel transistor and the select transistor. Accordingly, the CNVM cell of the present invention can be beneficially utilized in low voltage CMOS devices in that they can be programmed, erased, and read using relatively low operating voltages.

According to another aspect of the present invention, program and erase operations are self-regulated by the p-channel and n-channel transistors. Cell over-erase, which is a serious problem in conventional EEPROM cells, is not a critical issue with the CNVM cells of the present invention. In conventional EEPROM cells, when over-erase causes the threshold voltage of the EEPROM cell to go down, the bit line column becomes shunted, thereby making programming impossible. In contrast, even if a CNVN cell is overerased, the overerased CNVM cell can still be programmed because programming is performed using the p-channel portion of the CNVM cell. Accordingly, the CNVM cells of the present invention avoid the need for the complicated logic and verification circuitry needed to control program/erase levels in conventional NVM arrays.

In accordance with another aspect of the present invention, the CNVM cells can be fabricated using either a single polycrystalline silicon (polysilicon) layer CMOS process, or a multiple polysilicon layer CMOS process. In one embodiment, a stacked arrangement is formed by a polysilicon control gate structure formed over a polysilicon floating gate structure, thereby providing a minimal cell size. In another embodiment, the control gate is interdigitated with the floating gate, with both gates being formed form a single polysilicon layer, thereby minimizing fabrication process time and facilitating the use of standard CMOS process providing a single polysilicon layer.

BRIEF DESCRIPTION OF THE DRAWINGS

These and other features, aspects and advantages of the present invention will become better understood with regard to the following description, appended claims, and accompanying drawings, where:

FIGS. 2(A) and 3(B) are partial cut-away views illustrating a programming operation and an erase operation of the complementary non-volatile memory device of FIG. 1;

DETAILED DESCRIPTION OF THE DRAWINGS

Figure 1:
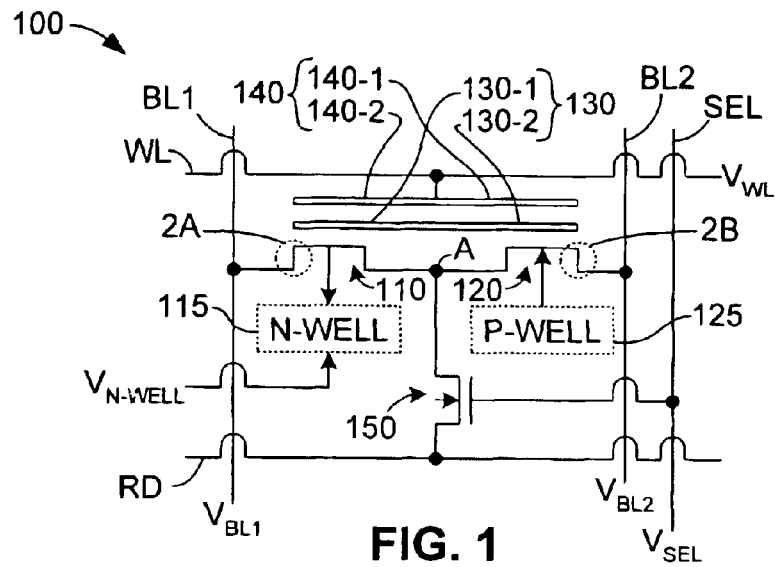
FIG. 1 is a simplified schematic diagram showing a complementary non-volatile memory device according to an embodiment of the present invention.

FIG. 1 is a simplified schematic diagram showing a complementary non-volatile memory (CNVM) cell 100 according to an embodiment of the present invention. CNVM cell 100 includes both a p-channel non-volatile memory (NVM) transistor 110 and an n-channel NVM transistor 120 that share a floating gate structure 130 and a control gate structure 140. In particular, p-channel transistor 110 includes source and drain regions (terminals) that are separated by a channel region and formed in an n-type well (N-WELL) 115, a first portion 130-1 of shared floating gate structure 130 extending over the channel region between the source and drain regions, and a first portion 140-1 of shared control gate structure 140 that is formed adjacent to (e.g., over) first floating gate portion 130-1. Similarly, n-channel transistor 120 includes source and drain regions that are formed in a p-type well (P-WELL) 125 and separated by a channel region, a second portion 130-2 of shared floating gate structure 130 extending over the channel region between the source and drain regions, and a second portion 140-2 of shared control gate structure 140 that is formed adjacent to second floating gate portion 130-2. The drains of p-channel transistor 110 and n-channel transistor 120 are connected together at a node A, which in turn is connected to one terminal of a select transistor 150.

CNVM cell 100 is connected into an associated array by several control lines that are shared by associated cells (not shown). Specifically, the source terminal of p-channel transistor 110 is connected to a first bit line BL1, which is controlled by a voltage source (not shown) to carry a first bit line control signal $V_{BL1}$. Similarly, the source of n-channel transistor 120 is connected to a second bit line BL2, which is controlled by another voltage source (not shown) to carry second bit line control signal $V_{BL2}$. Select transistor 150 is a "normal" (i.e., volatile) n-channel FET connected between node A and a read bit line (RD), and has a gate terminal connected to a select line (SEL), which is controlled by another voltage source (not shown) to carry a row select signal $V_{SEL}$. Note that a bias voltage signal $V_{N-WELL}$ is applied to n-well 115 and is controlled by another voltage source (not shown), and is typically transmitted to the n-well regions associated with an entire column of CNVM cells, not to each cell individually. Note also that p-well region 125 is coupled to the substrate.

In accordance with the conventional utilized herein, floating gate 130 is "programmed" when it stores a net negative charge, and is "erased" when the net negative charge is removed or floating gate 130 stores a net positive charge. In particular, floating gate 130 is "programmed" when it stores a negative charge that is sufficient to turn on p-channel transistor 110 during read operations even when a predetermined high word line voltage $V_{WL}$ (e.g., +1.8 Volts) is transmitted to control gate 140 (i.e., the high control gate voltage is insufficient to overcome the negative voltage stored on floating gate 130 and turn on n-channel transistor 120). Similarly, floating gate 130 is "erased" when the net negative charge is removed or it stores a net positive charge that is sufficient to turn on n-channel transistor 120 during read operations when a high word line voltage $V_{WL}$ is transmitted to control gate 140, and is also sufficiently positive to prevent p-channel transistor 110 from turning on when the word line control voltage $V_{WL}$ is 0 Volts.

According to an aspect of the present invention, by using shared floating gate 130 and shared control gate 140 to control the operation of p-channel transistor 110 and n-channel transistor 120, CNVM cell 100 facilitates band-to-band tunneling (BBT) during both program and erase operations, which in turn facilitates the low current/low voltage operation and the formation of CNVM cell 100 using standard CMOS fabrication processes.

Figure 2A:
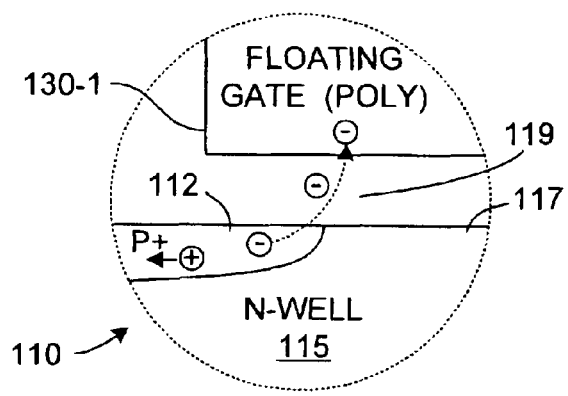

During program operations, a negative voltage (i.e., less than 0 Volts) is applied to the (P+) source region of p-channel transistor 110, and a positive voltage (i.e., greater than 0 Volts) is applied to control gate 140 (the source of n-channel transistor 120 and the drains of p-channel transistor 110 and n-channel transistor 120 are floating, and n-well region 115 is grounded (i.e., maintained at 0 Volts)). As indicated in FIG. 2(A), under these voltage conditions electron-hole pairs are generated in the source region 112 of p-channel transistor 110. The electrons are accelerated by a lateral electric field toward the channel region 117 of p-channel transistor 110, and some of these electrons attain high energy. These high-energy electrons pass through tunnel (bottom) oxide 119 separating source region 112 and first floating gate portion 130-1, and become trapped in floating gate structure 130.

Figure 2B:
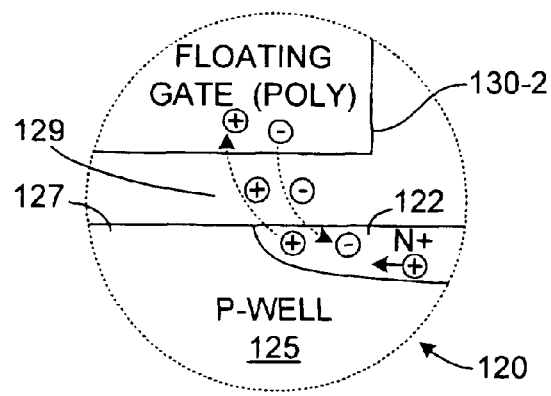

Similarly, during erase operations, a positive voltage is applied to the (N+) source region 122 of n-channel transistor 120, and a negative voltage is applied to control gate 140 (the source of p-channel transistor 110, the drains of p-channel transistor 110 and n-channel transistor 120, and n-well region 115 are floating). As indicated in FIG. 2(B), under these voltage conditions, electron-hole pairs are generated in source region 122 of n-channel transistor 120 such that the holes are accelerated by a lateral electric field toward the channel region 127, and causing the injection of BBT holes into second floating gate portion 130-2 (or the back-tunneling of electrons from second floating gate portion 130-2 to source region 122) through lower oxide 129.

Note that floating gate structure 130 and control gate structure 140 are constructed using a suitable material (e.g., polysilicon) to produce essentially identical electric fields in the channel regions of both p-channel transistor 110 and n-channel transistor 120. That is, when floating gate 130 is programmed in the manner described above, both first floating gate portion 130-1 and second floating gate portion 130-2 store the same negative voltage. Conversely, when floating gate 130 is erased in the manner described above, both first floating gate portion 130-1 and second floating gate portion 130-2 store the same positive voltage. That is, floating gate 130 generates the same vertical field in both p-channel transistor 110 and n-channel transistor 120. Similarly, control gate structure 140 is formed by a section of polysilicon such that word line control signal $V_{WL}$ produces the same electric field in the channel regions of both p-channel transistor 110 and n-channel transistor 120. The electric fields of floating gate 130 and control gate 140 at a given time are superimposed, and determine which portion of CNVM cell 100 (i.e., p-channel transistor 110 or n-channel transistor 120) is open.

In contrast to CNVM cell 100, which facilitates both low power program and erase operations, conventional p-channel NVM cells may support programming by BBT injection of electrons, but require another (e.g., Fowler-Nordheim) erase method. Similarly, conventional n-channel NVM cells may support low voltage "source side" erase operations (i.e., erasing effectively by the "BBT injection of holes" method described above), but require another program method (e.g., CHE). In either case, conventional single-transistor NVM cells require high voltage (which requires additional thick gate oxide) or high current (which greatly increases power consumption) to support the "other" (non-BBT) program/erase method. Conversely, CNVM cell 100 provides a structure in which both p-channel transistor 110 and n-channel transistor 120 share a single floating gate (i.e., floating gate structure 130), thereby facilitating both BBT programming of the floating gate (i.e., through p-channel transistor 110) and BBT erasing of the floating gate (through n-channel transistor 120). Because BBT injection, which is a relatively low voltage process, is used for both program and erase, there is no need for additional gate oxide compared with that used in the standard CMOS process. Accordingly, the use of CNVM cell 100 for embedded non-volatile memory in a CMOS device is beneficial because CNVM cell 100 can be fabricated using the same "standard" CMOS process used to fabricate the "normal" FETs of the CMOS device (i.e., the additional mask and oxide deposition steps needed to form conventional embedded NVM cells are avoided). Moreover, because CNVM cell 100 is programmed/erased by applying opposite (i.e., positive and negative) voltages to control gate 140 and the source regions 112 and 122, the absolute value of the program/erase voltages is low, thereby avoiding problems with diode breakdowns without requiring non-standard CMOS fabrication techniques. In contrast, to utilize opposite program/erase voltages a conventional NVM cell using Fowler-Nordheim tunneling, the NVM cell must be fabricated using a p-well formed in a deep n-well to isolate the p-well from the system power supply.

According to another aspect of the present invention, by connecting the drains of n-channel transistor 110 and p-channel transistor 120 at node A and applying appropriate voltages to bit lines BL1 and BL2, CNVM 100 facilitates a low voltage read operation that is similar to the operation of a CMOS inverter. In one embodiment, during a read operation, first bit line BL1 and word line WL are raised to a positive voltage (e.g., 1.8 Volts), second bit line BL2 is grounded (i.e., maintained at 0 Volts), and select transistor 150 is turned on (e.g., a relatively high positive voltage (e.g., 5 Volts) is transmitted on select line SEL). Under these conditions, when floating gate 130 is programmed (i.e., stores a net negative charge), p-channel transistor 110 is turned on despite the high word line signal $V_{WL}$, thereby pulling up read line RD via p-channel transistor 110 and select transistor 150. This high read voltage is detected using, for example, a well-known sense amplifier circuit (not shown) that is connected to read bit line READ. Conversely, when floating gate 130 is erased (i.e., stores a net positive charge), n-channel transistor 120 is turned on when the word line signal $V_{WL}$ is pulled high, thereby pulling down read line RD via n-channel transistor 120 and select transistor 150. Accordingly, the use of CNVM cell 100 can be beneficially utilized in low power CMOS devices in that CNVM cell 100 can be programmed, erased, and read using relatively low operating voltages and currents.

According to another aspect of the present invention, program and erase operations are self-regulated by p-channel transistor 110 and n-channel transistor 120, thereby avoiding the need for space-consuming logic and verification circuitry needed to prevent over-erase or over-program in conventional NVM cells. For example, as mentioned above with reference to FIG. 2(B), erase operations are performed by applying a negative voltage to control gate 140, applying a positive voltage to source region 122 of n-channel transistor 120, and floating the drain region of n-channel transistor 120, thereby generating electron-hole pairs in source region 122. As the charge stored by floating gate 130 decreases, the threshold voltage of n-channel transistor 120 decreases and can even become negative. At the same time, p-channel transistor 110 is closed by the charge stored on floating gate 130. Therefore, there is no overerase issue in the sense of erroneous read of the bit line column, and difficulties during programming. On the contrary, overerasing CNVM cell 100 will "help" the program operation because it will enhance the vertical field necessary for BBT of electrons in the drain of p-channel transistor 110. Accordingly, CNVM cells 100 have another benefit for use as embedded non-volatile memory in CMOS devices in that complicated circuitry for verifying program/ erase levels, which is required in conventional NVM arrays, is not required. Instead, simplified "single shot" program/ erase operations can be utilized in which program/erase voltages are applied for predetermined amounts of time. By simplifying the circuitry needed to operate an array of CNVM cells, the amount of substrate area needed to implement an embedded array of CNVM cells in a CMOS device is reduced, thereby reducing the overall cost per CMOS device.

Figure 3:
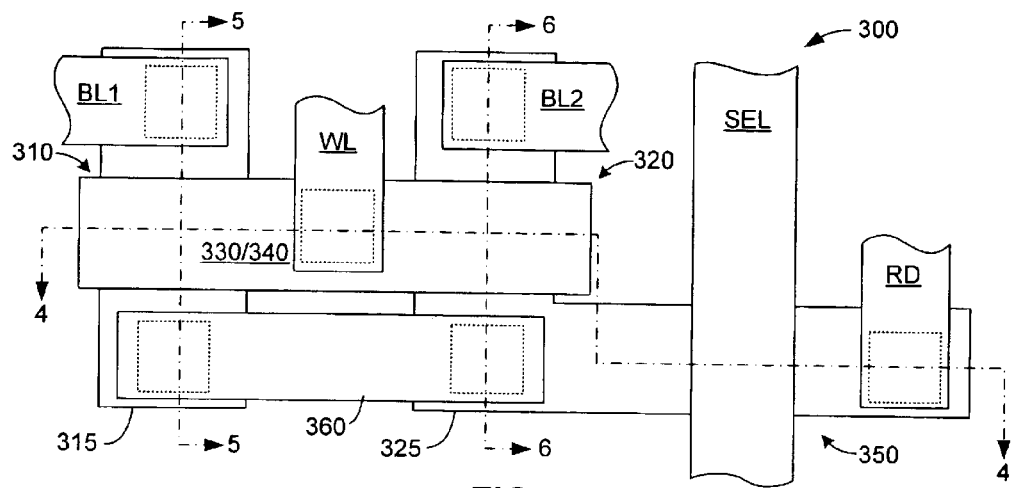
FIG. 3 is a plan view showing a simplified multi-layer complementary non-volatile memory cell according to a specific embodiment of the present invention.
Figure 4:
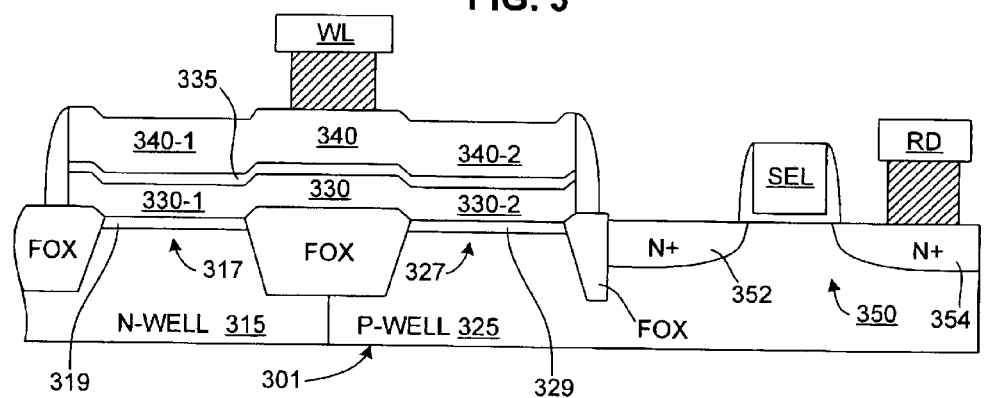
FIG. 4 is a cross sectional side view showing a portion of the CNVM cell taken along section line 4—4 of FIG. 3.
Figures 5, 6:
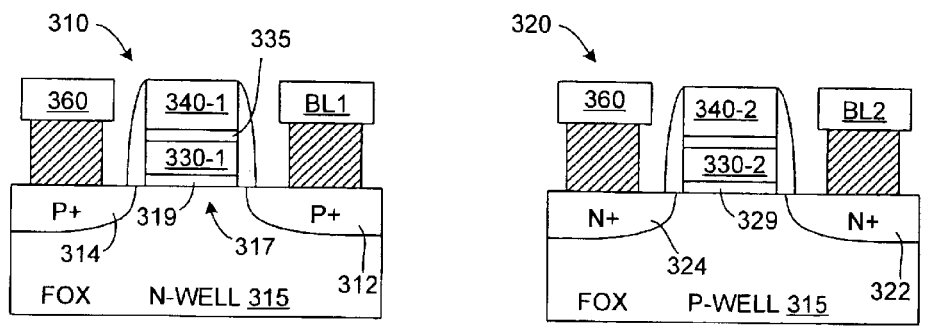
FIG. 5 is a cross sectional side view showing a p-channel transistor of the CNVM cell taken along section line 5—5 of FIG. 3.
FIG. 6 is a cross sectional side view showing an n-channel transistor of the CNVM cell taken along section line 6—6 of FIG. 3.

FIG. 3 is a top plan view showing a CNVM cell 300 according to a specific embodiment of the present invention. FIGS. 4, 5, and 6 are cross-sectional side views showing portions of CNVM cell 300 taken along section lines 4—4, 5—5, and 6—6, respectively. According to another aspect of the present invention, CNVM cell 300 is fabricated using multiple polysilicon layers, which may not be available in some "standard" CMOS processes, but provides a smaller cell size than that of the single polysilicon embodiment discussed below.

Referring to FIGS. 3 and 4, CNVM cell 300 is formed on a semiconductor (e.g., monocrystalline silicon) substrate 301. Similar to CNVM cell 100 (discussed above), CNVM cell 300 includes both a p-channel NVM transistor 310 and an n-channel NVM transistor 320 that share a stacked polysilicon arrangement including a floating gate 330 and a control gate 340. P-channel transistor 310 is formed in an n-well region 315, and n-channel transistor 320 is formed in a p-well region 325. CNVM cell 300 also includes a select transistor 350 that is formed in p-well region 325. As indicated in FIG. 3, the source terminal of p-channel transistor 310 is connected by a metal contact structure to a first bit line BL1, and the source of n-channel transistor 320 is connected to a second bit line BL2. The drain terminals of p-channel transistor 310 and n-channel transistor 320 are connected by a metal structure 360. As shown in FIG. 4, select transistor 350 has a first terminal 352 connected to the drain terminals of p-channel transistor 310 and n-channel transistor 320, a second terminal 354 connected to a read bit line RD, and a gate terminal formed by a select line SEL.

As indicated in FIG. 4, the stacked polysilicon arrangement forming floating gate 330 and control gate 340 extends over both p-channel transistor 310 and n-channel transistor 320. In particular, floating gate 330 includes a first floating gate portion 330-1 located on a lower gate oxide 319, and a second floating gate portion 330-2 located on a lower gate oxide 329. Similarly, control gate 340 is formed on an upper (top) oxide region 335 over floating gate 330, and includes a first control gate portion 340-1 located over first floating gate portion 330-1, and a second floating gate portion 340-2 located over second floating gate portion 330-2. As indicated in FIG. 5, p-channel transistor 310 includes source region 312 and drain region 314 separated by channel region 317, with first floating gate portion 330-1 and first control gate portion 340-1 located over channel region 317. Similarly, as indicated in FIG. 6, n-channel transistor 320 includes source region 322 and drain region 324 separated by channel region 327, with second floating gate portion 330-2 and second control gate portion 340-2 located over channel region 327.

Figure 7:
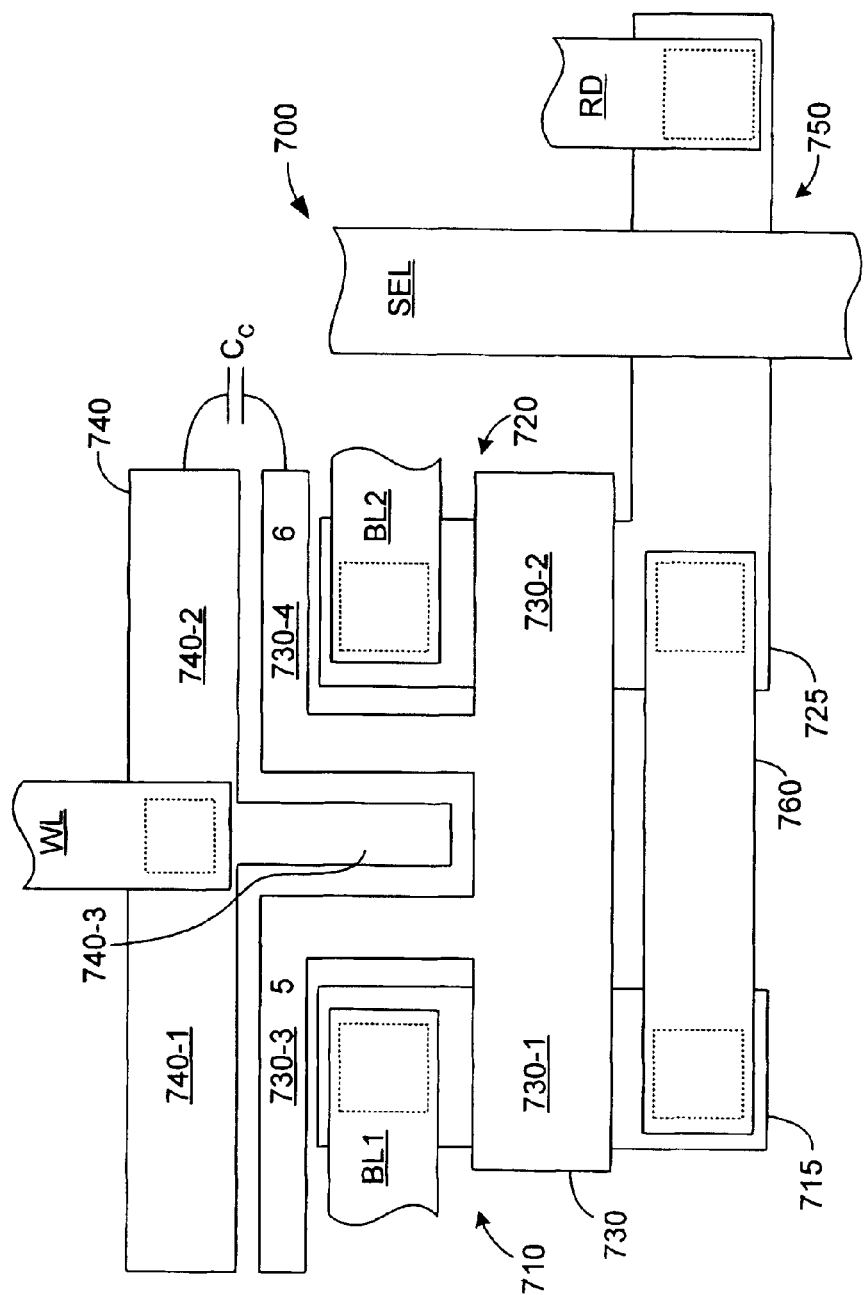
FIG. 7 is a plan view showing a simplified single-layer complementary non-volatile memory cell according to another specific embodiment of the present invention.

FIG. 7 is a top plan view showing a CNVM cell 700 according to another specific embodiment of the present invention. Similar to the various embodiments described above, CNVM cell 700 includes a p-channel NVM transistor 710 formed in an n-well region 715, and includes an n-channel NVM transistor 720 and a select transistor 750 formed in a p-well region 725. In addition, a metal structure 760 is connected between drain regions of p-channel transistor 710 and n-channel transistor 720 in the manner described above. However, in contrast to multi-layer CNVM cell 300 (see FIG. 3), a floating gate 730 and a control gate 740 of CNVM cell 700 are fabricated using a single polysilicon layer and arranged in the interdigitated manner shown in FIG. 3. In particular, floating gate 730 includes a first floating gate portion 730-1 formed over a channel of p-channel transistor 710 and a second floating gate portion 730-2 formed over a channel of n-channel transistor 720. In addition, floating gate 730 includes a third portion 730-3 that extends from first floating gate portion 730-1 and extends along a first portion 740-1 of control gate 740, and floating gate 730 includes a fourth portion 730-4 that extends from second floating gate portion 730-2 and extends along a second portion 740-2 of control gate 740. Moreover, control gate 740 includes a finger (third) portion 740-3 that extends into a channel formed by third portion 730-3 and fourth portion 730-4. By varying the distance between these portions of floating gate 730 and control gate 740, a capacitive coupling $C_C$ is established that facilitates operation of CNVM 700 in the manner described above. Accordingly, a non-volatile memory device is provided that exhibits the benefits described above with respect to low voltage operation, and can be fully formed using a standard single polysilicon CMOS process.

Although the present invention has been described with respect to certain specific embodiments, it will be clear to those skilled in the art that the inventive features of the present invention are applicable to other embodiments as well, all of which are intended to fall within the scope of the present invention. Thus, the invention is limited only by the following claims.

What is claimed is:

1. A complementary non-volatile memory cell comprising:
  a p-channel transistor having a source region and a drain region separated by a first channel, the drain region being connected to a node;
  an n-channel transistor having a source region and a drain region separated by second channel, the drain region being connected to the node; and
  a select transistor having a first terminal connected to the node, and a second terminal connected to a read bit line,
  wherein the n-channel transistor and the p-channel transistor share a floating gate structure that extends over the first and second channel regions.

2. The complementary non-volatile memory cell according to claim 1, wherein the p-channel transistor is formed in an n-type well region, and wherein the n-channel transistor and the select transistor are formed in a single p-type well region.

3. A complementary non-volatile memory cell comprising:
  a p-channel transistor having a source region and a drain region separated by a first channel, the drain region being connected to a node;
  an n-channel transistor having a source region and a drain region separated by second channel, the drain region being connected to the node, wherein the n-channel transistor and the p-channel transistor share a floating gate structure that extends over the first and second channel regions;
  a control gate structure located adjacent to the floating gate structure; and
  means for applying a positive voltage on the control gate structure and a negative voltage on the source region of the p-channel transistor such that the floating gate structure is programmed by band-to-band tunneling of electrons.

4. A complementary non-volatile memory cell comprising:
  a p-channel transistor having a source region and a drain region separated by a first channel, the drain region being connected to a node;
  an n-channel transistor having a source region and a drain region separated by second channel, the drain region being connected to the node, wherein the n-channel transistor and the p-channel transistor share a floating gate structure that extends over the first and second channel regions;
  a control gate structure located adjacent to the floating gate structure; and
  means for applying a negative voltage on the control gate structure and a positive voltage on the source region of the n-channel transistor such that the floating gate structure is erased.

5. A complementary non-volatile memory cell comprising:
  a p-channel transistor having a source region and a drain region separated by a first channel, the drain region being connected to a node;
  an n-channel transistor having a source region and a drain region separated by second channel, the drain region being connected to the node, wherein the n-channel transistor and the p-channel transistor share a floating gate structure that extends over the first and second channel regions; and
  a control gate structure located adjacent to the floating gate structure,
  wherein the floating gate structure and the control gate structure comprise portions of a single polycrystalline silicon layer such that the control gate structure is formed next to the floating gate structure, and
  wherein the control gate structure comprises a finger portion extending between elongated portions of the floating gate structure.

6. A complementary non-volatile memory cell comprising:
  a p-channel transistor having a first source and a first drain separated by a first channel;
  an n-channel transistor having a second source and a second drain separated by a second channel;
  a floating gate structure extending over the first channel and the second channel;
  a control gate structure formed adjacent to the floating gate structure;
  a conductor connected between the first drain of the p-channel transistor and the second drain of the n-channel transistor; and
  a select transistor having a first terminal connected to the second drain of the n-channel transistor, and a second terminal connected to a read bit line.

7. The complementary non-volatile memory cell according to claim 6, wherein the p-channel transistor is formed in an n-type well region, and wherein the n-channel transistor and the select transistor are formed in a single p-type well region.

8. A complementary non-volatile memory cell comprising:
  a p-channel transistor having a first source and a first drain separated by a first channel;
  an n-channel transistor having a second source and a second drain separated by a second channel;
  a floating gate structure extending over the first channel and the second channel;
  a control gate structure formed adjacent to the floating gate structure; and
  means for applying a positive voltage on the control gate structure and a negative voltage on the source region of the p-channel transistor such that the floating gate structure is programmed by band-to-band tunneling of electrons.

9. A complementary non-volatile memory cell comprising:
  a p-channel transistor having a first source and a first drain separated by a first channel;
  an n-channel transistor having a second source and a second drain separated by a second channel;
  a floating gate structure extending over the first channel and the second channel;
  a control gate structure formed adjacent to the floating gate structure; and
  means for applying a negative voltage on the control gate structure and a positive voltage on the source region of the n-channel transistor such that the floating gate structure is erased.

10. A complementary non-volatile memory cell comprising:
- a p-channel transistor having a first source and a first drain separated by a first channel;
- an n-channel transistor having a second source and a second drain separated by a second channel;
- a floating gate structure extending over the first channel and the second channel; and
- a control gate structure formed adjacent to the floating gate structure,
- wherein the floating gate structure and the control gate structure comprise portions of a single polycrystalline silicon layer such that the control gate structure is formed next to the floating gate structure, and
- wherein the control gate structure comprises a finger portion extending between elongated portions of the floating gate structure.

11. A method for controlling a non-volatile memory cell including a p-channel transistor, an n-channel transistor, a floating gate structure extending over channel regions of both the p-channel transistor and the n-channel transistor, and a control gate structure located adjacent to the floating gate structure, the method comprising:
- applying a positive voltage on the control gate structure and a negative voltage on a source region of the p-channel transistor such that the floating gate structure is programmed by band-to-band tunneling of electrons, and
- applying a negative voltage on the control gate structure and a positive voltage on the source region of the n-channel transistor such that the floating gate structure is erased by back tunneling of electrons from the floating gate structure to the source region of the n-channel transistor and/or band-to-band hole injection into the floating gate structure.

12. The method according to claim 11,
- wherein a first drain region of the n-channel transistor is connected to a second drain region of the p-channel transistor, wherein the non-volatile memory cell further comprises a select transistor connected between a read bit line and the first and second drains, and wherein the method further comprises grounding the source region of the p-channel transistor, applying a positive voltage to the control gate and to the source region of the n-channel transistor, and turning on the select transistor,
- wherein when the floating gate is programmed, the p-channel transistor is turned on and the read bit line is pulled to ground, and
- wherein when the floating gate is erased, the n-channel transistor is turned on and the read bit line is pulled to a positive voltage.

* * * * *